United States Patent
Nomura et al.

(10) Patent No.: US 8,973,252 B2
(45) Date of Patent: Mar. 10, 2015

(54) FOLDED PLANAR LITZ WIRE AND METHOD OF MAKING SAME

(71) Applicant: Toyota Motor Engineering & Manufacturing North America, Inc., Erlanger, KY (US)

(72) Inventors: Tsuyoshi Nomura, Ann Arbor, MI (US); Ken Toshiyuki, Nissin (JP); Yuanbo Guo, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 93 days.

(21) Appl. No.: 13/628,635

(22) Filed: Sep. 27, 2012

(65) Prior Publication Data

US 2014/0085031 A1    Mar. 27, 2014

(51) Int. Cl.
*H01F 7/06* (2006.01)

(52) U.S. Cl.
USPC ............................................................ 29/606

(58) Field of Classification Search
USPC ............................ 336/200, 232; 29/729, 606
See application file for complete search history.

(56) References Cited

U.S. PATENT DOCUMENTS

| | | | | |
|---|---|---|---|---|
| 2,911,605 A | * | 11/1959 | Wales, Jr. | 336/200 |
| 2,943,966 A | * | 7/1960 | Leno et al. | 336/200 |
| 2,961,747 A | * | 11/1960 | Lyman | 29/605 |
| 3,697,911 A | * | 10/1972 | Strauss, Jr. | 336/84 R |
| 4,792,790 A | | 12/1988 | Reeb | |
| 4,799,119 A | * | 1/1989 | Rossi et al. | 360/125.01 |
| 5,116,304 A | | 5/1992 | Cadwell | |
| 6,060,882 A | | 5/2000 | Doty | |
| 6,229,126 B1 | | 5/2001 | Ulrich et al. | |
| 6,885,354 B2 | | 4/2005 | Takei | |
| 7,973,635 B2 | | 7/2011 | Baarman et al. | |
| 8,191,241 B2 | | 6/2012 | Olson | |
| 8,387,234 B2 | * | 3/2013 | Olson | 29/729 |
| 2009/0121955 A1 | | 5/2009 | Kubo et al. | |
| 2009/0302986 A1 | | 12/2009 | Bedea | |
| 2011/0050381 A1 | | 3/2011 | Olson | |
| 2012/0029343 A1 | | 2/2012 | Wasson et al. | |

OTHER PUBLICATIONS

Wang et al, Reduction of High-Frequency Conduction Losses Using a Planar Litz Structure, IEEE Transactions on Power Electronics, vol. 20, No. 2, Mar. 2005.

Zhao et al, Reduction of AC Resistance in MEMS Intraocular Foil Coils Using Microfrabricated Planar Litz Structure, NEMS 2012, Kyoto, Japan, Mar. 5-8, 2012.

(Continued)

*Primary Examiner* — Tuyen Nguyen

(74) *Attorney, Agent, or Firm* — Christopher G. Darrow; Young Basile Hanlon & MacFarlane PC

(57) ABSTRACT

Several embodiments of a circuit device using principles of planar Litz wire construction are disclosed using flexible printed circuit boards on which a given set of conductors is located on one surface only. The FPCBs are folded at strategic locations to effectively cause conductors in adjacent parallel planes to effectively cross one another to realize the advantages of braided Litz wire conductors, but without the use of vias or circuit interconnections between opposite sides of any given FPCB or between different sections of a continuous FPCB wherein each section defines its own coil or coil set.

9 Claims, 5 Drawing Sheets

(56) References Cited

OTHER PUBLICATIONS

Pollock et al, The Design of Barrel-Wound Foil Windings with Multiple Layers Interchanged to Balance Layer Currents, Thayer School of Engineering, undated.

Nigam et al, Multi-Layer Folded High-Frequency Torodial Inductor Windings, IEEE Applied Power Electronics Conference, Feb. 2008, pp. 682-688.

Xiao, Planar Magnetics Design for Low-Voltage DC-DC Converters, University of Central Florida, Thesis submitted 2004.

Wang, Modeling and Design of Planar Integrated Magnetic Components, Virginia Polytechnic Institute and State University, Blacksburg, Virgina, Thesis submitted Jul. 21, 2003.

\* cited by examiner

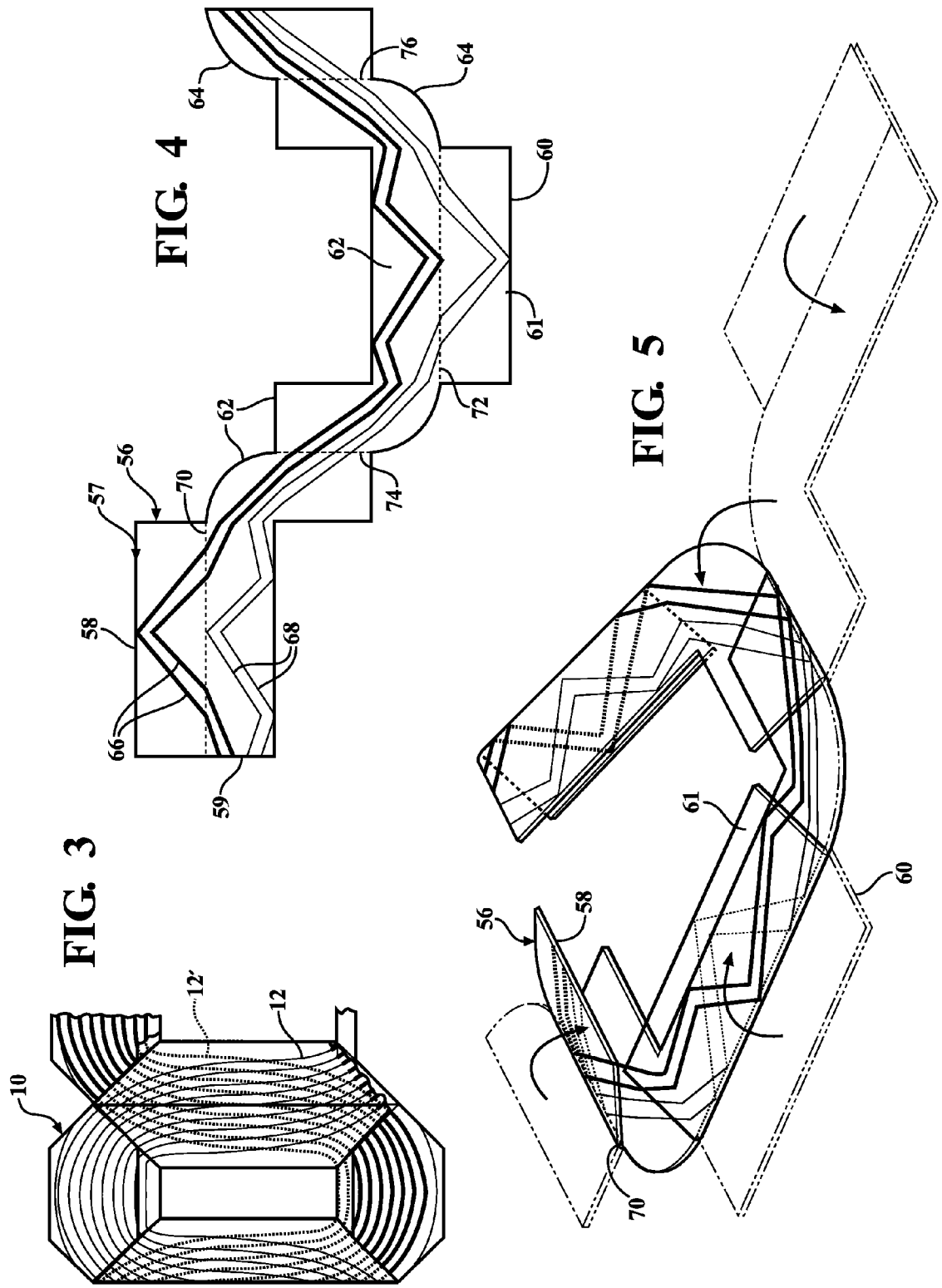

FOLDED PLANAR LITZ WIRE AND METHOD OF MAKING SAME

FIELD OF THE INVENTION

This disclosure pertains to electronic components such as conductors and transformer coils characterized by low AC, high frequency resistance and an absence of through-hole connections, such as vias.

BACKGROUND OF THE INVENTION

Conventional Litz wire conductors are cable-type conductors used in electronics to carry alternating current. One purpose is to reduce skin effect and proximity losses in conductors. A conventional Litz wire consists of many thin wire strands, individually insulated and twisted or woven together following one of several patterns. The winding pattern generally equalizes the proportion of the overall length over which each strand is at the outside of the conductor.

Planar unwoven Litz wires are known to be used in combination with two-sided printed circuit boards (PCBs) using a large number of vias to connect conductors deposited on opposite sides of a board. The fabrication technology is such that the vias show significantly higher resistivity and cost compared to the Litz conductors on the PCB surface.

SUMMARY OF THE INVENTION

The present invention uses principles of planar, unwoven Litz conductors on printed circuit boards to achieve low resistance at higher frequencies without the disadvantages associated with vias and other connectors between opposite sides of a PCB or between multiple PCBs in a stack. In general, this is achieved by placing planar Litz wire conductors on only one side of a flexible printed circuit board (FPCB) followed by strategic folding of the FPCB to effectively produce conductor crossings thereby to realize the effects of twisted or braided wire conductors without the necessity for vias or for insulating each conductor from adjacent conductors. The techniques of the present invention can be used not only to produce a single conductor or coil but also to produce windings having any desired number of coils through three-dimensional stacking produced by a repeating pattern of FPCB sections with folding lines at strategic points on or between FPCB sections.

Numerous embodiments of the invention are disclosed herein. Common to all of the embodiments is the development and use of a flexible printed circuit board defining, in the unfolded state, a series of sections or sections joined by turn sections and the location or deposition of multiple non-crossing planar Litz-type conductors which extend over one surface of the FPCB without interruption through the leg and turn sections in such a way as to cross fold lines which, when exercised, produces the effect of crossing conductors. In some embodiments, conductors on the FPCB not only effectively cross one another but "flip" position thereby to produce averaging of current distribution and the magnetic effects caused thereby.

In one specific embodiment hereinafter described in detail, planar Litz conductors are deposited on one surface of an FPCB having straight sections or sections interspersed with turning sections of alternately opposite direction with fold lines in both the straight and turning sections. When folded, the Litz conductors which cross the fold line are arranged underneath (or over) parallel conductors so as to effectively cross those conductors one or more times. The fold lines can be arranged in such a way as to produce a closed figure or coil carrying multiple conductors; e.g., 60 or more essentially parallel conductors deposited on the FPCB in very thin layers. Crossings occur as a result of fold lines in some coil sections while "flipping"; i.e., lateral position reversals, occur in other coil sections.

As hereinafter explained and illustrated in greater detail, the FPCB pattern can extend in a repeating zigzag fashion for as far as is necessary to produce multiple parallel windings requiring no electrical connectors or vias to produce as many turns or coils as are desired.

In another embodiment, the FPCB is arranged in multiple, parallel straight sections joined by folding "flip" lines and the conductors are deposited on one surface only of the unfolded FPCB in a serpentine or sinusoidal fashion, ultimately crossing the fold or flip line of one straight section to the adjacent straight section, and then onto the next section for as far is desired to build a three-dimensional stacked arrangement of "windings" when the straight sections are folded along parallel fold lines and the so-folded sections are flipped over on top of one another progressively. Again, a multi-turn coil can be produced without the use of vias or highly resistive electrical interconnections between turns on different sections of the FPCB.

Other advantages, features and characteristics of the present invention, as well as methods of operation and functions of the related elements of the structure, and the combination of parts and economies of manufacture, will become more apparent upon consideration of the following detailed description and the appended claims.

BRIEF SUMMARY OF THE DRAWINGS

The description herein makes reference to the accompanying drawings wherein like reference numerals refer to like parts throughout the several views and wherein:

FIG. 3 is a plan view of a folded FPCB showing how conductors effectively cross;

FIG. 4 is a plan view of another embodiment;

FIG. 5 is a perspective view of the FIG. 4 embodiment partially folded;

DETAILED DESCRIPTION OF THE ILLUSTRATIVE EMBODIMENT

Figure 1:
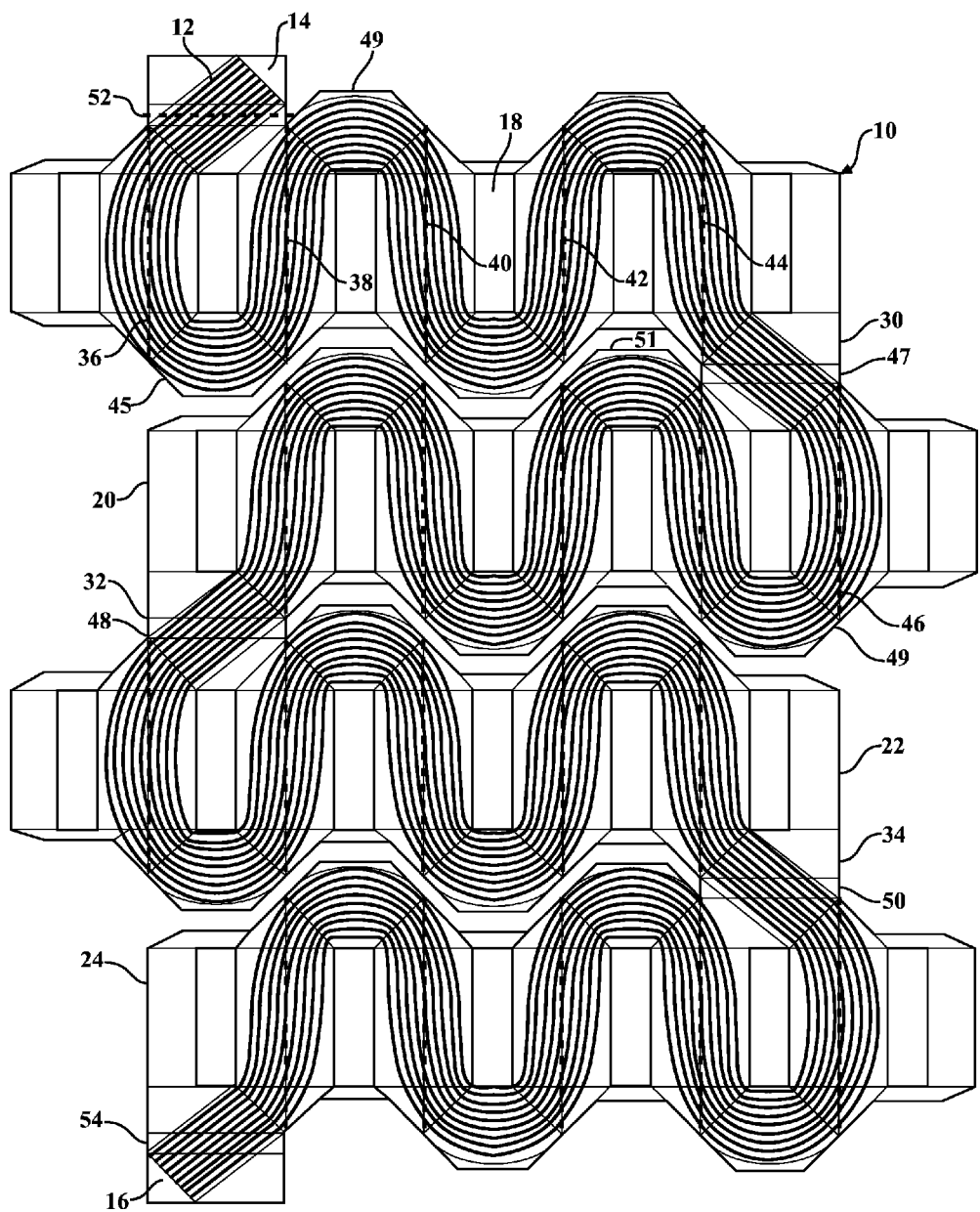
FIG. 1 is a plan view of planar Litz conductors deposited on a developed (unfolded) FPCB having predetermined fold lines.

FIG. 1 shows the developed (unfolded) layout of a multi-winding coil fabricated on a flexible printed circuit board 10 having deposited thereon a number of planar Litz wire conductors 12 arranged in a complex, reversing sinusoidal pattern between an input 14 and an output 16. Only nine lines are shown for the conductors 12 in FIG. 1 but it is to be understood that one of the advantages of the present invention is that it allows for a very fine pitch (distance between centers of adjacent conductors) to be used thereby accommodating a large number of conductors in a smaller surface area. Accordingly, the number of conductors in a practical application of the invention may be much more than nine.

The flexible printed circuit board 10 (FPCB) comprises, in this example, four parallel straight sections 18, 20, 22 and 24 joined by connector sections 30, 32, 34 at alternatingly opposite lateral ends of the design. Vertical fold lines 36, 38, 40, 42, 44 and 46 run through the FPCB. In addition, a fold line 52 and fold areas 47, 48, 50, 54 may be provided.

The parallel conductors 12 start at the input 14 on a diagonal pattern crossing the fold lines 52 and 36; only some of the conductors cross the fold line 36 and then turn back on themselves at the turning area 45 and extend up across the horizontal section 18 toward a reverse turning area 49. This sine wave pattern continues throughout the upper horizontal straight section 18 until it reaches the vertical connector sections 30, 47 and then reverses direction, repeating the sinusoidal pattern from right to left across horizontal section 20. Only some of the conductors cross the fold line 46 area until the conductors reach another reverse fold area 48 where they flow into the straight horizontal section 22. This pattern repeats all the way through to define four horizontal sections and, ultimately, four coils, until the conductors reach the output area 16. It will be noted that at all times, the conductors 12 are on one side of the FPCB. Before folding, the conductors 12 may be said to be in one plane. After folding, parts of the conductors remain in the original plane whereas other parts are in a new, parallel plane. If the folds are effectuated so that the conductors 12 are on the outside surfaces of the folded FPCB, the two planes are separated by two thicknesses of the FPCB.

Figure 2:
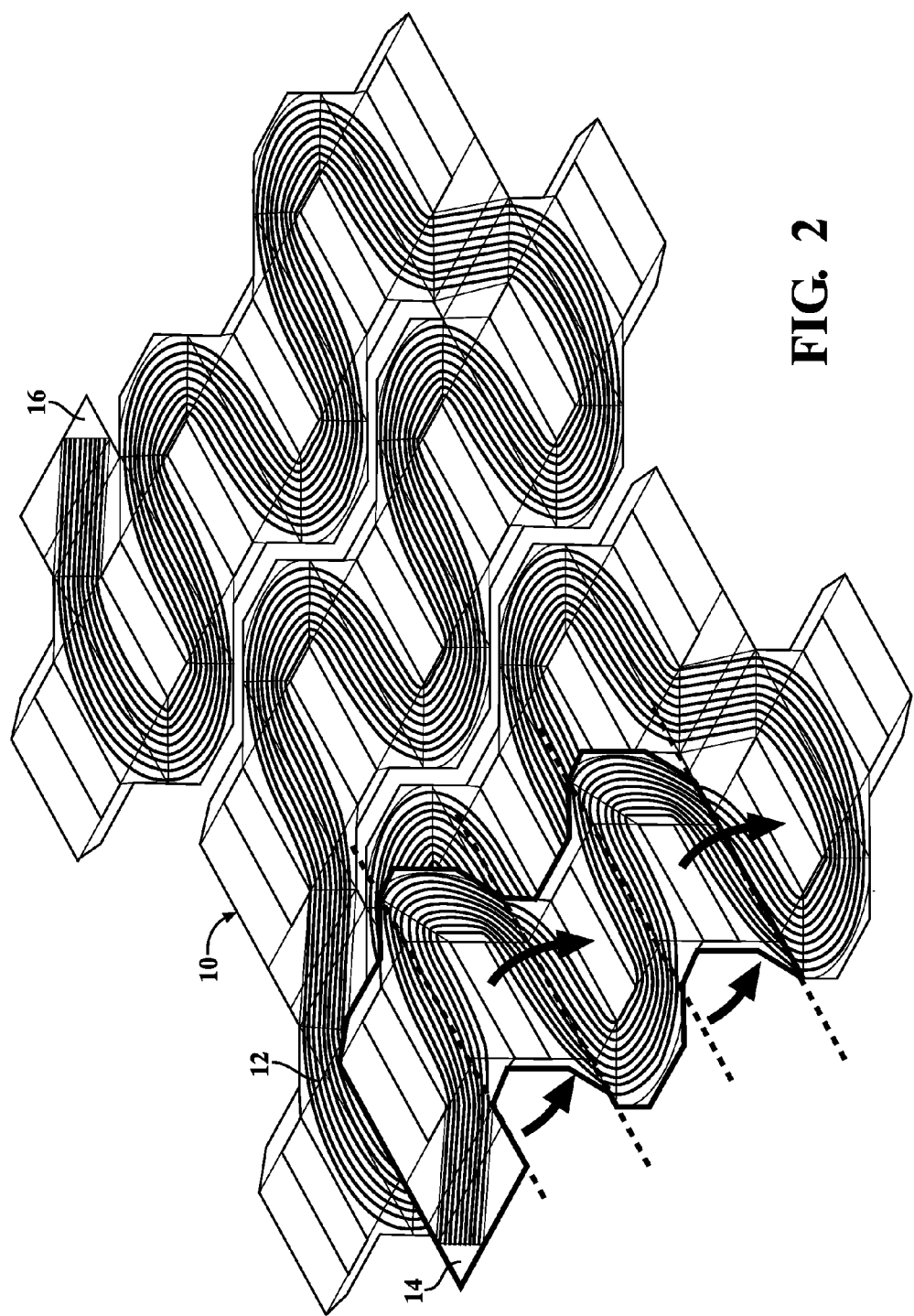
FIG. 2 is a perspective view of the FPCB of FIG. 1 with folding in beginning stages.

FIG. 2 illustrates how the FPCB 10 is folded. First, all of the fold lines in the upper straight section 18 are exercised, folding the portions of the straight section 18 between the fold lines fully back upon themselves in alternating fashion until all of the folds have been fully made. The first fully folded section 18 is then flipped over onto the second straight section 20 and that section is folded repeatedly back and forth along the fold lines making another flat coil wherein the conductors 12 cross one another in the straight sections as shown in FIG. 3. The reference numeral 12 is used along with solid lines to represent the conductors on the top side of the folded printed circuit board whereas the dotted lines and the reference numeral 12' is used to show the opposite or hidden side of the FPCB 10. It will be noted that they all cross one another when viewed in projection, thus producing the cancellation effect of traditional Litz wire conductors. The configuration of FIGS. 1 and 2 produces a four-coil assembly with the conductors extending around the edges produced by 180° folds, eliminating the need for vias between opposite sides of the FPCB.

Figure 6:
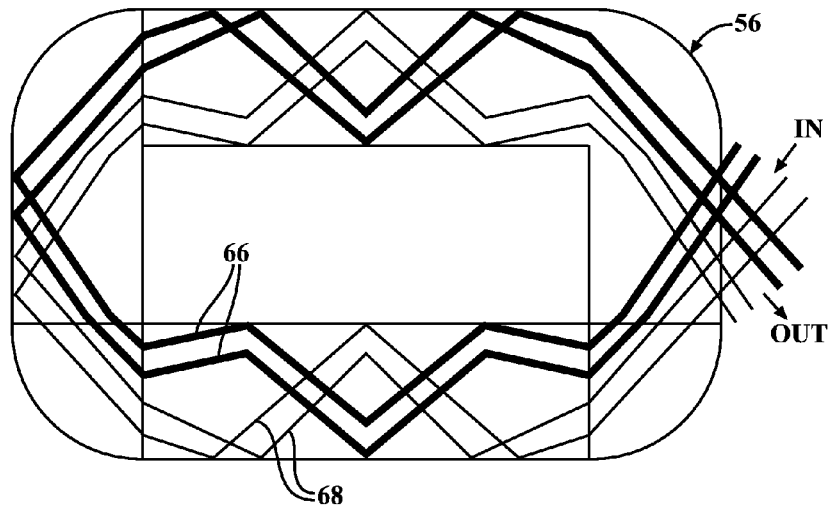
FIG. 6 is a plan view of the fully folded FPCB of FIG. 4 showing conductors on both sides in different degrees of boldness.

Referring now to FIGS. 4-6, another embodiment is illustrated. In this embodiment, a flexible printed circuit board (FPCB) 56 is shown having alternate straight sections 57, 60 joined by opposite direction turning sections 62, 64, straight section 56 has upper and lower portions 58, 59 joined by a horizontal fold line 70 whereas the straight section 60 has upper and lower portions 61, 63 joined by a fold line 72. Crossing section 62 has a fold line 74 whereas crossing section 64 has a fold line 76.

A first set of parallel, planar Litz wire conductors 66 is deposited entirely on the top side of the developed or unfolded FPCB 56 as shown in FIG. 4. The conductors zigzag through portion 57, cross the fold line 70 twice, pass through the turning section 62 crossing the fold line 74 and then zigzag through the upper portion 62 of the straight section 60 before entering the turning section 64 and crossing the fold line 76.

Another set of planar Litz wire conductors 68 is deposited on the same side of the unfolded FPCB 56 as the conductors 66 and generally run parallel to them but in a somewhat opposite fashion in that the conductors 68 do not cross the fold line 70 in the straight section 57 but, like the conductors 66, cross the fold line 74 in the turning section 62. It is to be noted that the conductors 68 (shown in light line) cross the fold line 72 and run to the outside of the straight section 60 whereas they are confined entirely to the inside of the straight section 58 thus giving rise to the flipping effect described above to produce averaging of the flux fields when the conductors 66, 68 are excited by an AC current.

FIG. 5 shows how the fold lines 70, 72, 74 and 76 are exercised in converting the unfolded single-sided arrangement of FIG. 4 into a double-sided arrangement to complete a full coil having input and output ends as shown in FIG. 6. Again, the conductors 68 are shown in fine or light lines while the conductors 66 are shown in heavy or bold lines, it will be noted that the conductors not only effectively cross each other multiple times (in projection; i.e., the paths on one FPCB side cross the paths on the other side) despite the absence of vias to transfer the conductors from one side of the FPCB 66 to the other. Moreover, there is a flipping effect as described above wherein the conductors 66 move from the outside of the folded straight sections to the inside after going through a turning section, such as 62.

Figure 7:
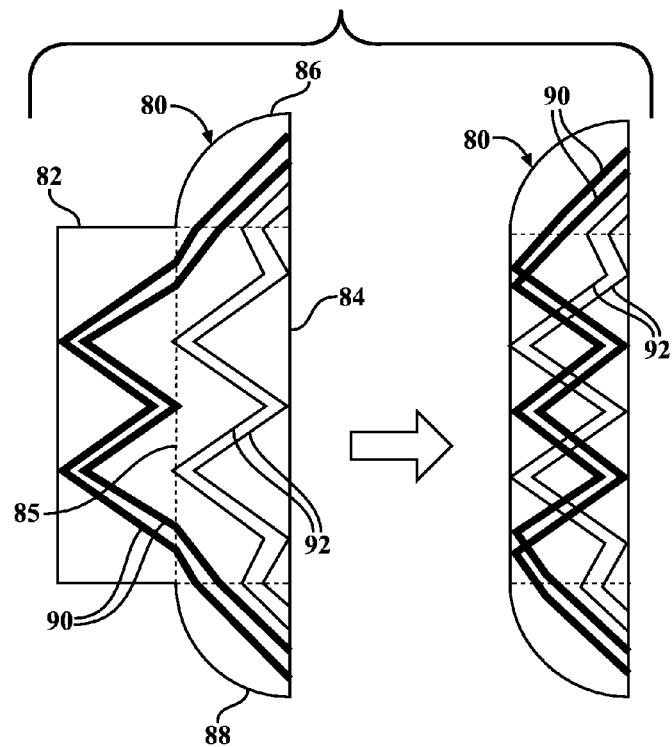
FIG. 7 is a plan view of another embodiment similar to FIG. 5 but with additional crossings.

FIG. 7 illustrates a variation of the principles used in the embodiment of FIG. 4. In the FIG. 7 embodiment, flexible printed circuit board 80 has a straight section made up of folded portions 82, 84 having a vertical fold line 85 between them. Turning sections 86, 88 are provided at the top and bottom of the straight section 82, 84. A first set of conductors 90 is shown having multiple zigzag bends in the straight section 82 whereas the conductor 66 in the straight section 58 of FIG. 4 have only one zigzag turn. Similarly, a second set of generally parallel conductors 92 have more zigzag turns in each straight section such as 84 than the conductors 68 in the embodiment of FIG. 4. The result after folding along the line 85 is a larger number of crossings. Again, it will be understood that some of the conductors shown in the right side of FIG. 7 are on the top side of the FPCB 80 whereas other crossing conductors are on the bottom side as a result of a folding along the fold line 85. There is no flipping effect in the arrangement shown in FIG. 7 primarily because both of the turning sections 86, 90 are in the same direction.

Figure 8:
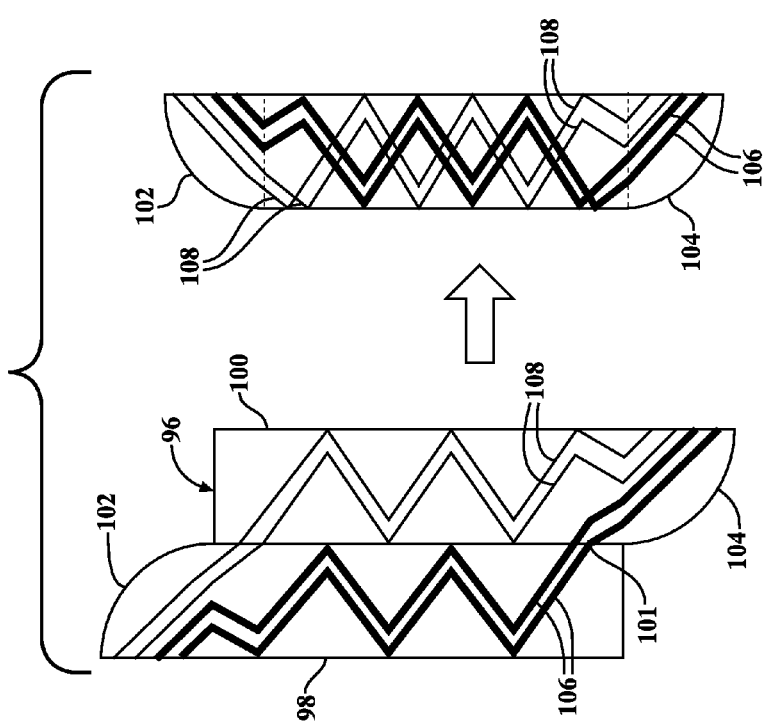
FIG. 8 is a plan view of still another embodiment similar to FIG. 7 but with crossings and flipping.

However, looking to FIG. 8, there is shown another embodiment comprising a flexible printed circuit board 96 having a straight section with portions 98, 100 joined by a fold line 101. A first set of multiple zigzag conductors 106 is deposited on the top surface of the unfolded FPCB 96 and a second set of generally parallel conductors 108 is also printed on the said side. However, because the turning sections 102, 104 are in opposite directions, folding the FPCB 96 along the fold line 101 is shown on the right side of FIG. 8 results not only in five effective crossings but also flipping effect wherein the conductors 106 are on the outside of the lower turning section 104, but on the inside of the upper turning section 102.

Figure 9:
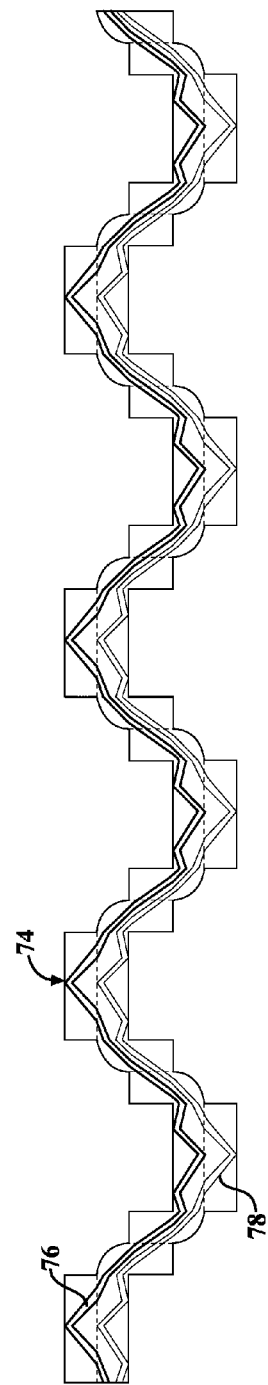
FIG. 9 is a developed (unfolded) view of another embodiment showing how the pattern of FIG. 4 is extended to produce additional coil layers.

FIG. 9 shows another embodiment of the invention which is effectively an extension of the embodiment shown in FIG. 4 wherein the printed circuit board 74 is extended back and forth through turning sections of alternately opposite direction to produce a multiple layer coil when fully folded along the fold lines indicated by the dotted line. This embodiment is similar to the embodiment of FIGS. 1 and 2 in that it produces a multi-turn coil having both crossing and flipping effect.

In all of the embodiments illustrated, all of the conductors are deposited on what is initially the same side of a flexible printed circuit board but become effectively crossing conductors when the circuit boards are folded back upon themselves; i.e., the turn "folding" as used herein, refers to a complete 180° fold wherein the two layers of the FPCB are folded and brought together on one another. In some cases, where the conductors remain on the outside of the FPCB, it is not necessary to provide insulation between them. In other cases, especially where multiple coils are stacked upon one another, insulation between the conductors of the layers of the stack can be achieved in various ways, including the use of inserts or deposited layers of dielectric (insulative) materials so that there is no short circuiting as a result of the contact between live conductors. It is also to be understood that while a small number of conductors is used for purposes of illustration in all of the figures, a practical embodiment of the invention will generally involve a larger number of conductors, for example, somewhere between 50 and 80 strands as indicated above. It is also to be understood that the use of both heavy and bold lines in showing conductors in these drawings is not intended to convey the impression that the conductors are necessarily of different sizes of gauges or current-carrying capabilities; rather, the use of bold and fine lines is simply to permit the reader to distinguish between conductors in different planes of the folded printed circuit board.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law. As an example, while all of the embodiments illustrated place conductor strands only on one side of a FPCB, practical applications may call for placing conductor strands in different circuits on opposite sides of a FPCB such that strands in a folded FPCB lie in four or more planes. The same principle applies to the use of multi-layer boards allowing for still greater numbers of strands in a single device. It is also to be understood that the use of the term "plane" herein does not suggest that the board sections defining the planes are necessarily flat; i.e., conductors may be in parallel "planes" in overlying faces of a folded printed circuit board.

What is claimed is:

1. A method of constructing a planar litz wire comprising the steps of:
    providing a flexible printed circuit board (FPCB) having one or more fold lines;
    locating a plurality of conductors on a side of the FPCB, the plurality of conductors being configured to be electrically in parallel with one another and each conductor of the plurality of conductors having an initial lateral position on the side of the FPCB; and
    folding the FPCB at least once along the one or more fold lines to produce a folded structure;
    wherein folding causes a first conductor of the plurality of conductors to at least partially overlap a second conductor of the plurality of conductors.

2. The method as defined in claim 1 wherein folding causes each conductor of the plurality of conductors to at least partially overlap a counter conductor of the plurality of conductors, each conductor of the plurality of conductors and its at least partially overlapping counter conductor of the plurality of conductors being electrically in parallel with one another.

3. The method as defined in claim 2 wherein each conductor of the plurality of conductors and its overlapping counter conductor of the plurality of conductors has an inverse initial lateral position.

4. The method as defined in claim 1 wherein the folded structure has a ring-like shape suitable for use as at least one winding of a coil.

5. The method as defined in claim 1 where the folded structure has a multilayered, ring-like shape suitable for use as multiple windings of a coil.

6. The method as defined in claim 1 wherein the folded structure is substantially linear.

7. The method as defined in claim 1 wherein folding causes a first conductor of the plurality of conductors to at least partially overlap a second conductor of the plurality of conductors at least three times.

8. The method as defined in claim 1 wherein folding creates a multiplicity of overlaps between a first conductor of the plurality of conductors and a second conductor of the plurality of conductors, the multiplicity of overlaps occurring periodically over at least half the length of the first conductor of the plurality of conductors.

9. The method as defined in claim 1 wherein the folded structure is further characterized by an absence of vias.

* * * * *